(12) United States Patent
Park

(10) Patent No.: US 7,682,862 B2
(45) Date of Patent: Mar. 23, 2010

(54) IMAGE SENSOR AND METHOD FOR MANUFACTURING THE SAME

(75) Inventor: Jeong-Su Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/957,217

(22) Filed: Dec. 14, 2007

(65) Prior Publication Data

US 2008/0150058 A1    Jun. 26, 2008

(30) Foreign Application Priority Data

Dec. 26, 2006  (KR) ............... 10-2006-0134235

(51) Int. Cl.
*H01L 21/00*   (2006.01)

(52) U.S. Cl. ................ 438/70; 438/72; 257/294; 257/E31.121

(58) Field of Classification Search ............... 438/48, 438/66, 70, 72; 257/292, 294, E31.121
See application file for complete search history.

(56) References Cited

U.S. PATENT DOCUMENTS

| | | | |
|---|---|---|---|
| 5,171,711 A * | 12/1992 | Tobimatsu | 438/614 |
| 7,235,428 B2 * | 6/2007 | Tanida et al. | 438/118 |
| 2006/0141653 A1* | 6/2006 | Choi | 438/48 |

FOREIGN PATENT DOCUMENTS

KR   1020040025218 A   3/2004

* cited by examiner

*Primary Examiner*—Quoc D Hoang
(74) *Attorney, Agent, or Firm*—Sherr & Vaughn PLLC

(57) ABSTRACT

A method for manufacturing an image sensor that can include forming a pad electrode over a semiconductor substrate; forming a protective layer over the pad electrode; forming a via hole through the protective layer to expose a portion of the uppermost surface of the pad electrode; and then forming a gold layer over the exposed portion of the uppermost surface of the pad electrode.

14 Claims, 2 Drawing Sheets

IMAGE SENSOR AND METHOD FOR MANUFACTURING THE SAME

The present application claims priority under 35 U.S.C. 119 and 35 U.S.C. 365 to Korean Patent Application No. 10-2006-0134235 (filed on Dec. 26, 2006), which is hereby incorporated by reference in its entirety.

BACKGROUND

An image sensor is a semiconductor device for converting optical signals into electrical signals. The image sensor may employ a switching mode for sequentially detecting an output by providing a plurality of photodiodes corresponding to the number of pixels using CMOS technology that uses peripheral devices, such as a control circuit and a signal processing circuit.

SUMMARY

Embodiments relate to an image sensor and a method for manufacturing the same capable of preventing a pad electrode from being contaminated by a base included in photoresist or developing solution.

Embodiments relate to a method for manufacturing an image sensor that can include at least one of the following steps: providing a semiconductor substrate including a pixel array region and a logic circuit region; forming a pad electrode in the logic circuit region; forming a protective layer over the pad electrode; forming a via hole by selectively removing portions of the protective layer to expose a portion of the uppermost surface of the pad electrode; forming a metal layer over the exposed portion of the uppermost surface of the pad electrode; forming a color filter over the protective layer in the pixel array region; and then forming a plurality of microlenses over the color filter.

Embodiments relate to a method for manufacturing an image sensor that can include at least one of the following steps: forming a pad electrode over a semiconductor substrate; forming a protective layer over the pad electrode; forming a via hole through the protective layer to expose a portion of the uppermost surface of the pad electrode; and then forming a gold layer over the exposed portion of the uppermost surface of the pad electrode.

Embodiments relate to an image sensor that can include: a semiconductor substrate including a pixel array region and a logic circuit region; a pad electrode formed in the logic circuit region; a metal layer formed over a portion of an exposed uppermost surface of the pad electrode; a protective layer formed over the semiconductor substrate including an exposed portion of the pad electrode; a color filter layer formed over the protective layer in the pixel array region; and a plurality of microlenses formed over the color filter layer

DRAWINGS

Example FIGS. 1 to 4 illustrate a method for manufacturing an image sensor, in accordance with embodiments.

DESCRIPTION

Figure 1:
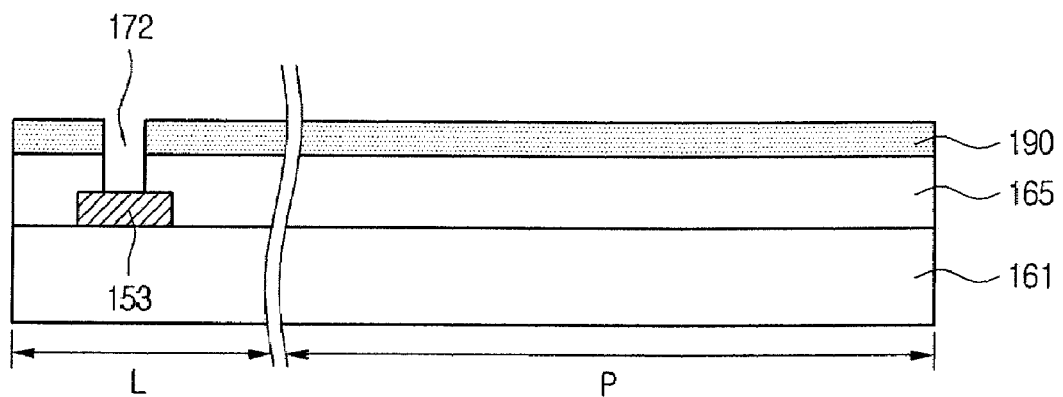

As illustrated in example in FIG. 1, interlayer dielectric layer 161 composed of an oxide material can be deposited on and/or over a semiconductor substrate divided into pixel array region P and logic circuit region L. Interlayer dielectric layer 161 can then be planarized through a chemical mechanical polishing (CMP). At this time, various kinds of interconnections, transistors, and photodiodes may be provided on and/or over the semiconductor substrate.

A metal layer may then be formed on and/or over interlayer dielectric layer 161. The metal layer may be composed of a metal material such as aluminum (Al) deposited on and/or over interlayer dielectric layer 161 through a sputtering process. The metal layer can then be patterned through a photoetching process, thereby forming pad electrode 153 in logic circuit region L.

Thereafter, an oxide layer may be deposited on and/or over the entire surface of the semiconductor substrate including the pad electrode 153, the surface of the resultant structure can be polished through a CMP process, thereby forming protective layer 165.

Photoresist 190 may then be coated on and/or over protective layer 165, and then patterned through a photoetching process. Protective layer 165 in the upper portion of pad electrode 153 may then be etched using photoresist 190 as a mask, thereby forming via hole 172. Via hole 172 can serve to facilitate the electronic connection of pad electrode 153 to an external driving circuit or for performing a probe test. After formation of via hole 172, photoresist 190 can be removed.

Figure 2:
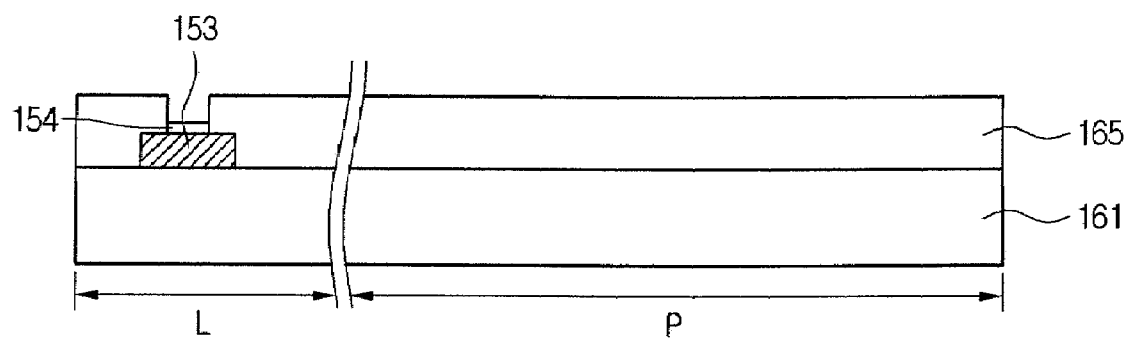

As illustrated in example FIG. 2, a metal layer composed of gold (Au) can then be formed on and/or over pad electrode 153 through an electrolysis plating process. Gold (Au) can be easily formed on and/or over pad electrode 153 composed of an aluminum material instead of protective layer 165 having no metal catalyst due to the characteristic of the electrolysis plating process. The metal layer composed of gold (Au) can have a thickness in a range of between 1 Å to 99 Å. The gold (Au) layer is advantageous since it is not corroded by the base included in the photoresist or the developing solution. Moreover, gold (Au) has superior conductivity, thereby improving the electric characteristics of pad electrode 153.

Figure 3:
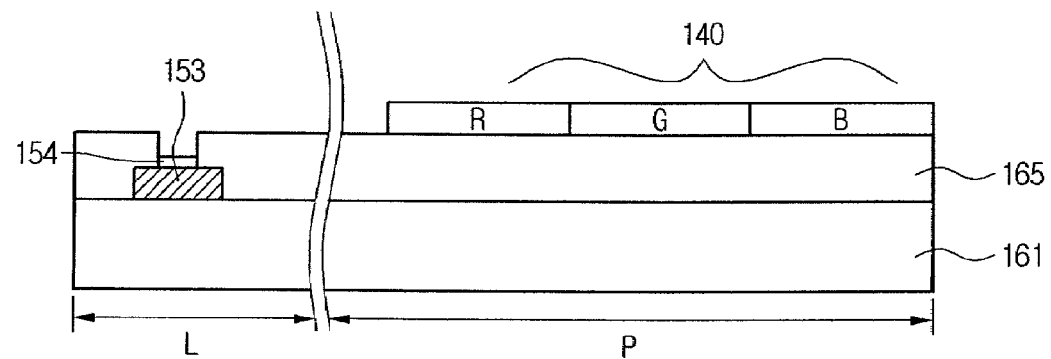

As illustrated in example FIG. 3, after coating a color photoresist on and/or over the entire surface of the semiconductor substrate including protective layer 165, a portion of the color photoresist can be selectively removed through a photoetching process using a mask, thereby forming color filter layer 140 having a predetermined pattern in pixel array region P. Color filter layer 140 can include red color filter R, green color filter G and blue color filter B.

Figure 4:
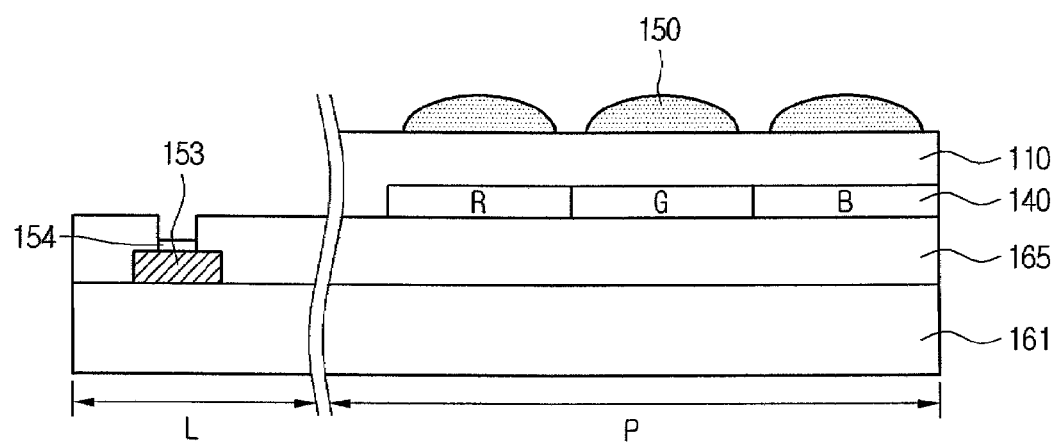

As illustrated in example FIG. 4, planarization layer 110 can then be formed on and/or over an uppermost surface of color filter layer 140. After coating a photoresist on and/or over planarization layer 110, the photoresist can be patterned in the shape of a trapezoid through a photoetching process using a mask. Thereafter, a reflow process can be performed with respect to the photoresist pattern such that a corner of the photoresist pattern is rounded, thereby forming a plurality of micro-lenses 150.

In accordance with embodiments, a metal layer composed of gold (Au) can be plated on a pad electrode, thereby forming an image sensor adaptable to prevent the pad electrode from being contaminated by a base included in a photoresist or developing solution.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
providing a semiconductor substrate including a pixel array region and a logic circuit region;
forming a dielectric layer composed of a first oxide material over the semiconductor substrate;
forming a pad electrode over and directly contacting the dielectric layer in the logic circuit region;
forming a protective layer composed of a second oxide material over and directly contacting the pad electrode and the dielectric layer;
forming a via hole by selectively removing portions of the protective layer to expose a portion of the uppermost surface of the pad electrode;
forming a metal layer over and directly contacting the exposed portion of the uppermost surface of the pad electrode such that the thickness of the metal layer is less than the depth of the via hole;
forming a color filter over and directly contacting the protective layer in the pixel array region after forming the metal layer; and then
forming a plurality of microlenses over the color filter.

2. The method of claim 1, wherein the metal layer comprises a gold layer.

3. The method of claim 2, wherein the gold layer is formed through an electrolysis plating process.

4. The method of claim 3, wherein the gold layer has a thickness in a range of between 1 Å to 99 Å.

5. The method of claim 1, wherein forming the via hole comprises:
depositing a photoresist over the protective layer;
patterning the photoresist through a photoetching process; and then removing the protective layer.

6. The method of claim 1, further comprising forming a planarization layer over the color filter layer before forming the plurality of microlenses.

7. The method of claim 1, wherein the pad electrode is formed through a sputtering process.

8. The method of claim 7, wherein the pad electrode is composed of a metal material.

9. The method of claim 8, wherein the metal material comprises aluminum.

10. A method comprising:
forming a first oxide layer over a semiconductor substrate;
forming a pad electrode over the semiconductor substrate and directly contacting the first oxide layer;
forming a second oxide layer over and directly contacting the pad electrode and the first oxide layer;
forming a via hole through the second oxide layer to expose a portion of the uppermost surface of the pad electrode; and then
forming a gold layer in the via hole over and contacting the exposed portion of the uppermost surface of the pad electrode such that a plane of the uppermost surface of the gold layer is below a plane of the uppermost surface of the second oxide layer forming a color filter over and directly contacting the second oxide layer in a pixel array region after forming the gold layer; and then forming a plurality of microlenses over the color filter.

11. The method of claim 10, wherein forming the via hole comprises:
depositing a photoresist over the second oxide layer;
patterning the photoresist through a photoetching process; and then
removing the second oxide layer.

12. The method of claim 10, wherein the gold layer is formed through an electrolysis plating process.

13. The method of claim 12, wherein the gold layer is formed with a thickness in a range of between 1 Å to 99 Å.

14. The method of claim 10, wherein the pad electrode is formed by depositing an aluminum material over the semiconductor substrate through a sputtering scheme.

* * * * *